United States Patent [19]

Bujatti et al.

[11] Patent Number: 4,925,723

[45] Date of Patent: May 15, 1990

[54] MICROWAVE INTEGRATED CIRCUIT SUBSTRATE INCLUDING METAL FILLED VIA HOLES AND METHOD OF MANUFACTURE

[75] Inventors: Marina Bujatti; Franco N. Sechi, both of Palo Alto, Calif.

[73] Assignee: Microwave Power, Inc., Santa Clara, Calif.

[21] Appl. No.: 251,538

[22] Filed: Sep. 29, 1988

[51] Int. Cl.$^5$ .............................................. B32B 3/00
[52] U.S. Cl. ..................................... 428/137; 428/209; 428/472; 428/901; 156/155; 29/592.1; 29/825; 29/852
[58] Field of Search ............... 29/592.1, 825, 852; 156/155; 428/137, 209, 472, 901

[56] References Cited

U.S. PATENT DOCUMENTS 3,205,298  9/1965  Kolt ..................................... 174/68.5
3,562,009  2/1971  Cranston et al. ..................... 430/945

Primary Examiner—Patrick Ryan
Attorney, Agent, or Firm—Flehr, Hohbach, Test, Albritton & Herbert

[57] ABSTRACT

The present invention is directed to a microwave integrated circuit formed on a substrate having via holes for either electrical grounding or heat dissipation or both and more particularly to a substrate including via holes which are filled with metal.

5 Claims, 2 Drawing Sheets

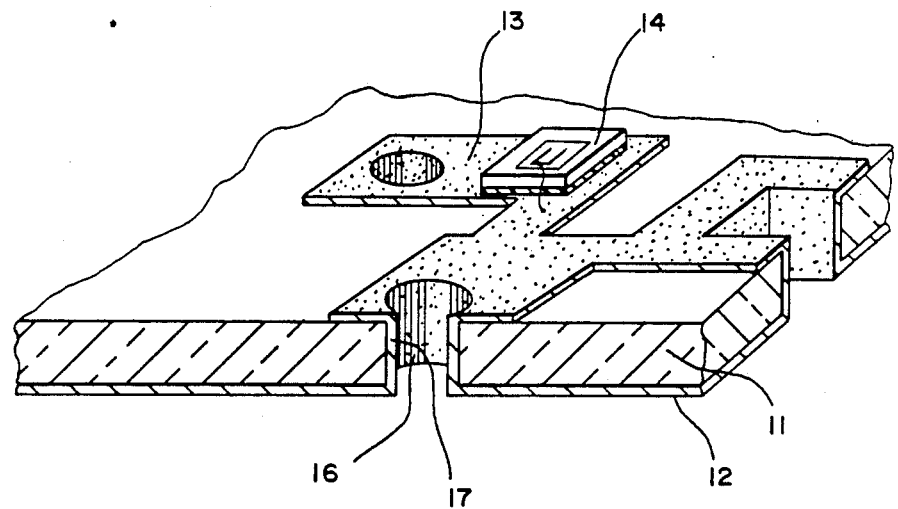
FIG.—1
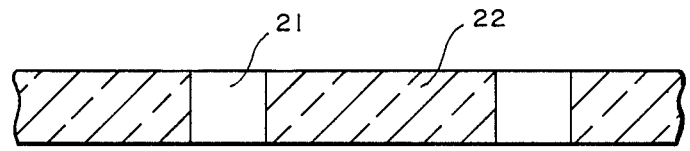
FIG.—2A
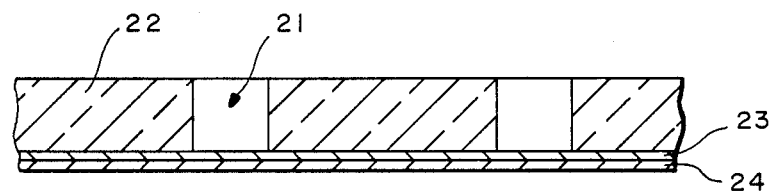
FIG.—2B

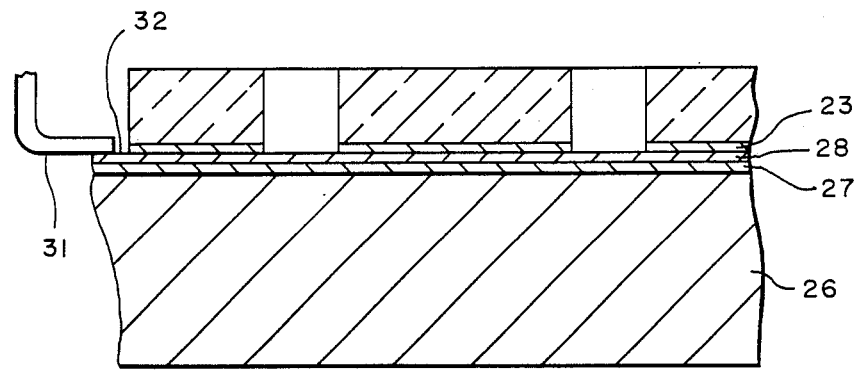
FIG.—2C
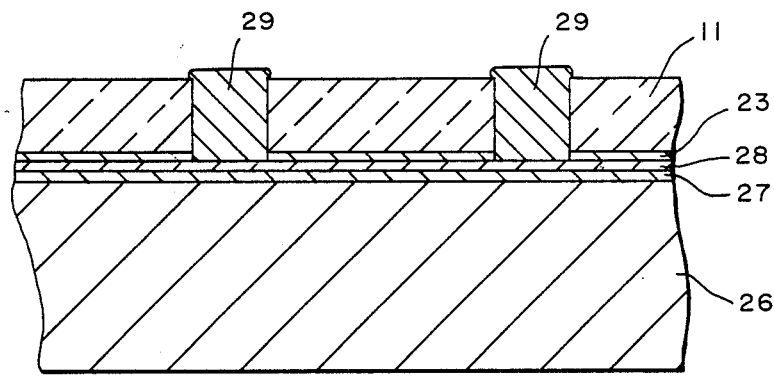
FIG.—2D
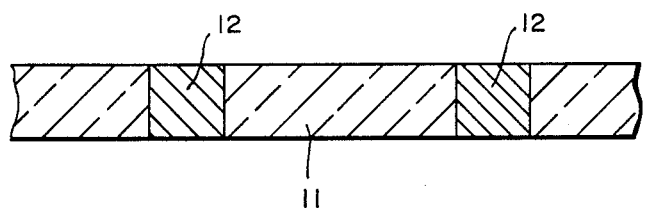
FIG.—3

MICROWAVE INTEGRATED CIRCUIT SUBSTRATE INCLUDING METAL FILLED VIA HOLES AND METHOD OF MANUFACTURE

BRIEF DESCRIPTION OF THE INVENTION

The present invention is directed to a microwave integrated circuit formed on a substrate having via holes for either electrical grounding or heat dissipation or both and more particularly to a substrate including via holes which are filled with metal.

BACKGROUND OF THE INVENTION

In the manufacturing of microwave integrated circuits formed on a substrate, it is often desirable to create direct connections between specific points of the circuit on the upper surface and the metallization on the lower surface. Such connections may be required for two different reasons: (1) to create a low inductance/low resistance path to ground; and (2) to provide an effective heat sinking, specifically for active devices. In the present state of the art when the substrate used is a ceramic substrate, such connections are typically obtained by cutting holes, referred to as "via holes" or "vias", through the substrate and by metallizing the wall of the holes. The holes may be cut either before or after processing the substrate. In the first case, the presence of holes significantly hinders the photolithography process, typically preventing the definition of fine details in the neighborhood of a hole. In the second case, the hole cutting process is severely limited by the need to preserve the integrity of the circuit already fabricated. This is especially true in the case of ceramic materials, e.g., alumina, where holes cannot be easily etched chemically and have to be drilled mechanically or by laser. Both processes are damaging to delicate circuit structures. In addition, the metallization of the wall alone may provide an adequate electrical connection but does not generally provide adequate heat conduction in the case of high power devices.

In the present state-of-the-art, the vias or holes are often filled with a conductive paste ("ink") of the type used in connection with thin film circuits. However, this process is only partially successful because during filling of the holes with the paste and subsequent curing, the volume of the paste is significantly reduced thereby creating voids in the filling.

OBJECTS AND SUMMARY OF THE INVENTION

It is an object of the present invention to provide a process capable of completely filling with metal the holes or vias in an insulating substrate used in microwave integrated circuits.

It is another object of the present invention to provide a substrate having via holes which extend between the top and bottom surfaces which are filled with metal to provide good conductive path between the surfaces.

The foregoing and other objects of the invention are achieved by a substrate comprising a body of insulating material having upper and lower surfaces with one or more holes formed in said body to extend between the upper and the lower surface and a metal filling said holes and extending between the upper and the lower surfaces. The invention is further directed to a method of forming the aforementioned substrate.

DESCRIPTION OF THE DRAWINGS

FIG. 1 shows a portion of a microwave integrated circuit with metallized via holes in accordance with the prior art.

FIGS. 2A-2D show in cross-section, a portion of a substrate and the method of forming metal filled via holes in accordance with the present invention.

FIG. 3 shows a finished substrate with filled via holes ready for metallization and photolithography processing.

DETAILED DESCRIPTION OF A PREFERRED EMBODIMENT

A typical prior art microwave integrated circuit is shown in FIG. 1. The substrate 11, typically alumina or beryllia, is coated on the lower surface with a metal coating or layer 12, typically a two-layer coating comprising a metal which adheres to the substrate such as chromium, and a good conductor, such as gold. A similar coating on the upper side is formed and shaped by photolithographic and etching techniques to yield the desired circuit geometry 13. Various components such as capacitors, resistors and, most important, active devices 14, may be attached at specific locations on the upper circuit. Selected points of the upper circuit are connected to the back side of the substrate by via holes 16 which have metallized walls 17. Active devices are typically located in the vicinity of the via holes both because one of their electrodes typically needs to be grounded to the backside metal layer 12 but also in order to help conduct heat generated by the device to the back surface where it is dissipated. However, unless the via holes are solidly filled, the device cannot be located on top of the hole, where it would be most desirable for heat dissipation.

In the preferred embodiment of the present invention, via holes 21 are drilled by a laser beam in the ceramic substrate 22 at selected locations, FIG. 2A. The substrate may then be coated with a laminated layer such as a layer including a positive dry film resist 23 carried by a mylar film 24, FIG. 2B. A suitable laminated layer including a dry film resist polymer is "Resolve" sold by Minnesota Mining and Manufacturing Company. The polymer film carried by the mylar preferably has good adherence to both ceramic and glass, and, to some extent, even to the mylar backing. The film supported by the mylar backing is preferably covered with a liner which is removed before applying the film to the substrate for lamination. The substrate with applied film is then preferably heated whereby the polymer film becomes brittle. The mylar backing is then removed. When the mylar backing is removed from the film, the film remains adhered to the substrate, however, the brittle portion over the holes is removed with the mylar whereby the substrate will be uniformly coated and the holes remain open. The laminating temperature is such as to achieve the desired brittleness and adhesion of the polymer film but avoid completely drying out the film so that by using a higher temperature, a second lamination can be carried out. As an example, a temperature of around 120 deg. C. for the first lamination and 140 deg. C. for the second lamination has been used in the case of the above mentioned laminated layered photoresist.

In an alternative embodiment of this invention the desired coverage of the substrate with polymer is achieved by laminating the polymer at a lower temperature, for example 90 deg. C., thereby avoiding brittleness. The polymer can then be exposed either through the substrate itself or through a suitable mask and dissolved away to leave the open holes with a polymer surface layer on the substrate.

After the desired coverage of the substrate is achieved with one of the described processes, or any other alternate process which will form a substrate with an adhesive layer, the substrate undergoes a second lamination process during which the substrate, already covered with the polymer film, is attached to a smooth, metallized backing plate, so that one end of the holes is closed by a metal.

In the preferred embodiment of this invention as shown in FIG. 2C, a glass slide 26 is metallized with a thick layer of copper 27 (about 10 microns), followed by a thin layer of gold 28 (about 0.1 micron). The gold layer is used to avoid oxidation while the thick layer of copper provides a low electrical resistance of the metal film as well as ease of etching after the process is completed. Any other suitable metal conductive layer can be used.

After the second lamination is completed, the substrate attached to the backing plate by the polymer layer 23 is ready for a plating operation. An electrical contact 31 is made to the metal backing layer which is slightly larger than the substrate, so that a metallized edge 32 will remain uncovered and provide easy electrical contact. The substrate, attached to the backing plate, is immersed in a plating bath such as a neutral gold bath suitable for low-stress fine grain deposits. Several suitable plating solutions are readily available and other metals besides gold might be considered, e.g. copper. Because the walls of the holes are not metallized, the lines of the electric field during plating will be approximately parallel to the hole walls and therefore the plating will take place approximately parallel to the bottom so as to fill the hole uniformly. After the holes are filled with metal, they start to develop the mushroom shape characteristic of plating not constrained by lateral walls, as shown in FIG. 2D, which depicts the cross-section of a portion of the substrate after the plating operation.

At this point the backing plate is separated from the substrate. In the specific embodiment described this is accomplished by etching the relatively thick copper layer deposited on the glass backing. In order to facilitate this operation, no adhesive layer is used on the glass so that the adherence is minimal and the etching solution (e.g. nitric acid) will readily penetrate. A variety of alternatives are clearly possible, including using a backing plate which is itself readily etchable, such as an aluminum sheet barely thick enough to provide minimal mechanical integrity. This could be easily etched away, e.g., with a sodium or potassium hydroxide solution.

After removing the backing plate, the residues of the gold film 28 and the polymer 23 are removed, e.g. by a combination of ultrasonic and ashing, so that the result of the described process is a substrate with holes filled by a solid column of gold 29. The side originally attached to the backing plate is typically fairly planar. The other, especially when some overplating has taken place, may require an additional planarization step. This is easily accomplished by a lapping operation where the surface of the ceramic substrate is hardly modified, since the gold is much softer and readily abraded. The substrate 11 at this point appears as in FIG. 3 and is ready for metallization and further processing to form a microwave integrated circuit having a metallized lower layer with circuits on the upper layer.

Thus, there has been provided a substrate with metal filled via holes and a method of forming the substrate.

We claim:

1. A microwave integrated circuit substrate comprising:
    a body of insulating material having upper and lower surfaces with one or more holes formed in said body to extend between the upper and lower surface; and
    a metal substantially filling all of said holes and extending between and coplanar with the upper and lower surfaces.

2. A microwave integrated circuit with via holes filled with plated metal.

3. A substrate as in claims 1 or 2 in which the substrate is ceramic.

4. A substrate as in claim 1 or 2 in which the substrate is alumina.

5. The method of forming a substrate for microwave integrated circuits comprising:
    forming holes or vias at selected locations in a substrate;
    closing one end of said holes or vias with a conductive film which extends on the surface of the substrate;
    plating metal through the holes or vias onto said conductive film until the holes or vias are filled with plated metal; and
    removing said conductive film to leave a substrate with vias or holes filled with plated metal.

* * * * *

(12) REEXAMINATION CERTIFICATE (4695th)
United States Patent
Bujatti et al.

(10) Number: US 4,925,723 C1
(45) Certificate Issued: Dec. 31, 2002

(54) MICROWAVE INTEGRATED CIRCUIT SUBSTRATE INCLUDING METAL FILLED VIA HOLES AND METHOD OF MANUFACTURE

(75) Inventors: Marina Bujatti, Palo Alto, CA (US); Franco N. Sechi, Palo Alto, CA (US)

(73) Assignee: Microwave Power, Inc., Santa Clara, CA (US)

Reexamination Request:
No. 90/005,848, Oct. 18, 2000

Reexamination Certificate for:
Patent No.: 4,925,723
Issued: May 15, 1990
Appl. No.: 07/251,538
Filed: Sep. 29, 1988

(51) Int. Cl.[7] ................................................. B32B 3/00
(52) U.S. Cl. ..................... 428/137; 428/209; 428/472; 428/901; 156/155; 29/592.1; 29/825; 29/852
(58) Field of Search ............................ 428/137, 209, 428/472, 901; 74/250, 257, 262

(56) References Cited

U.S. PATENT DOCUMENTS

| 3,205,298 | A |   | 9/1965  | Kalt            |         |
|-----------|---|---|---------|-----------------|---------|
| 3,562,009 | A |   | 2/1971  | Cranston et al. |         |
| 5,100,714 | A | * | 3/1992  | Zsamboky        | 428/209 |
| 5,260,119 | A | * | 11/1993 | Jean et al.     | 428/210 |
| 5,855,995 | A | * | 1/1999  | Haq et al.      | 428/210 |
| 6,093,476 | A | * | 7/2000  | Horiuchi et al. | 428/210 |

FOREIGN PATENT DOCUMENTS

GB        2046514       11/1980

OTHER PUBLICATIONS

European Search Report (no date).*

* cited by examiner

*Primary Examiner*—Cathy Lam

(57) ABSTRACT

The present invention is directed to a microwave integrated circuit formed on a substrate having via holes for either electrical grounding or heat dissipation or both and more particularly to a substrate including via holes which are filled with metal.

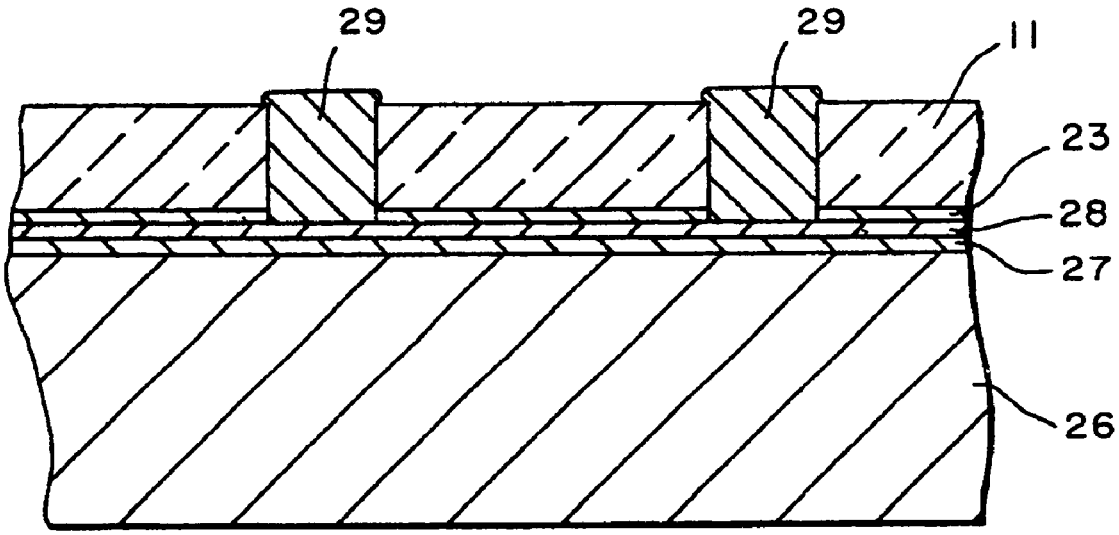

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 5 is confirmed.

Claims 1–4 are cancelled.

\* \* \* \* \*